(12) United States Patent
Chang

(10) Patent No.: US 9,875,906 B2
(45) Date of Patent: *Jan. 23, 2018

(54) MECHANISMS FOR FORMING PATTERNS USING MULTIPLE LITHOGRAPHY PROCESSES

(71) Applicant: Taiwan Semiconductor Manufacturing Company., Ltd., Hsin-Chu (TW)

(72) Inventor: Shih-Ming Chang, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/076,199

(22) Filed: Mar. 21, 2016

(65) Prior Publication Data
US 2016/0203991 A1 Jul. 14, 2016

Related U.S. Application Data

(63) Continuation of application No. 14/457,282, filed on Aug. 12, 2014, now Pat. No. 9,293,341.

(60) Provisional application No. 62/019,100, filed on Jun. 30, 2014.

(51) Int. Cl.
H01L 21/302 (2006.01)
H01L 21/461 (2006.01)
H01L 21/308 (2006.01)
H01L 21/311 (2006.01)
H01L 21/027 (2006.01)
H01L 21/3105 (2006.01)
H01L 21/033 (2006.01)
H01L 21/3213 (2006.01)

(52) U.S. Cl.
CPC ...... H01L 21/3086 (2013.01); H01L 21/0274 (2013.01); H01L 21/0337 (2013.01); H01L 21/31053 (2013.01); H01L 21/31144 (2013.01); H01L 21/32139 (2013.01)

(58) Field of Classification Search
CPC ............. H01L 21/3213; H01L 21/3219; H01L 21/32193
USPC .................................................. 438/735, 736
See application file for complete search history.

(56) References Cited

U.S. PATENT DOCUMENTS

| 8,039,179 | B2 | 10/2011 | Shieh et al. |
| 8,202,681 | B2 | 6/2012 | Lin et al. |
| 8,647,521 | B2 * | 2/2014 | Jung ................... H01L 21/0337 216/13 |

(Continued)

Primary Examiner — David Vu
Assistant Examiner — Brandon Fox
(74) Attorney, Agent, or Firm — Haynes and Boone, LLP

(57) ABSTRACT

A method for forming patterns in a semiconductor device includes providing a substrate and a patterning-target layer formed over the substrate; forming a first feature in a first hard mask layer formed over the patterning-target layer; and forming a second feature in a second hard mask layer formed over the patterning-target layer. The first hard mask layer has a different etching selectivity from the second hard mask layer. The method further includes selectively removing a portion of the first feature within a first trench to form a reshaped first feature. In an embodiment, the first trench exposes a portion of the second feature, and the selectively removing of the first portion of the first feature does not etch the portion of the second feature.

20 Claims, 12 Drawing Sheets

(56) References Cited

U.S. PATENT DOCUMENTS

| | | |
|---|---|---|
| 8,728,332 B2 | 5/2014 | Lin et al. |
| 8,822,243 B2 | 9/2014 | Yan et al. |
| 8,835,323 B1 * | 9/2014 | Shieh ................. H01L 21/3086 216/41 |
| 9,159,560 B2 * | 10/2015 | Seo ..................... H01L 21/0337 |
| 9,245,763 B2 | 1/2016 | Chang |
| 9,293,341 B2 * | 3/2016 | Chang ................. H01L 21/3086 |
| 2006/0091468 A1 | 5/2006 | Liaw |
| 2011/0281208 A1 | 11/2011 | Lin et al. |
| 2012/0278776 A1 | 11/2012 | Lei et al. |
| 2013/0295769 A1 | 11/2013 | Lin et al. |
| 2013/0320451 A1 | 12/2013 | Liu et al. |
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |
| 2015/0380256 A1 | 12/2015 | Chang |
| 2015/0380259 A1 | 12/2015 | Chang |
| 2015/0380261 A1 | 12/2015 | Chang |

\* cited by examiner

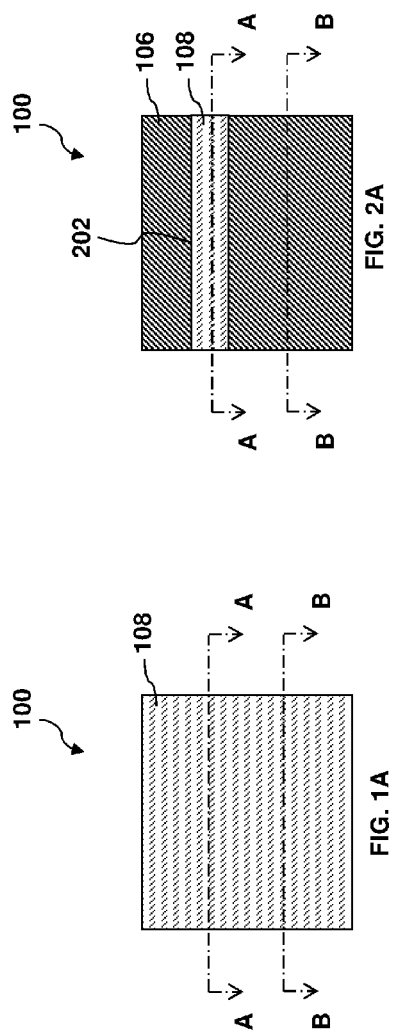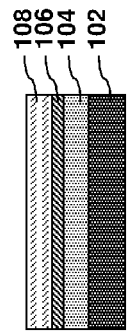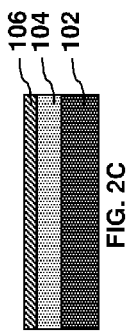

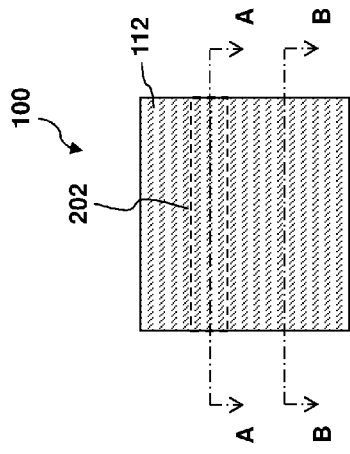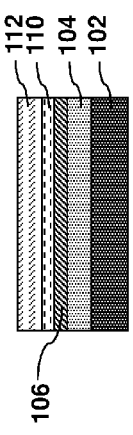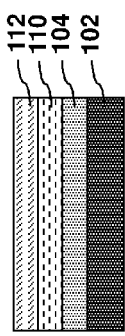
FIG. 4A    FIG. 4B    FIG. 4C
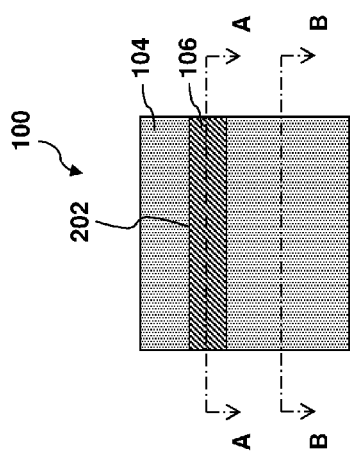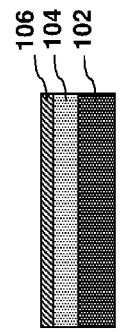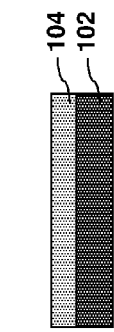
FIG. 3A    FIG. 3B    FIG. 3C

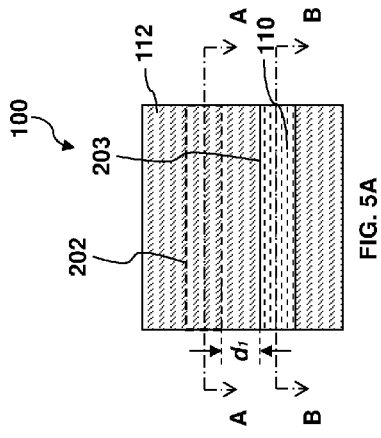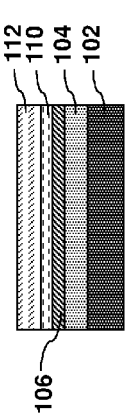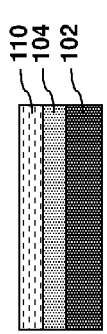
FIG. 6A  FIG. 6B  FIG. 6C
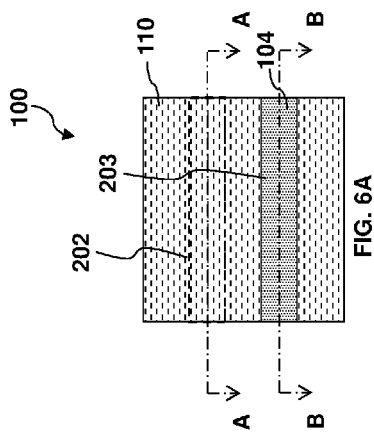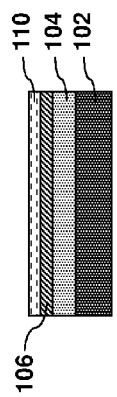
FIG. 5A  FIG. 5B  FIG. 5C

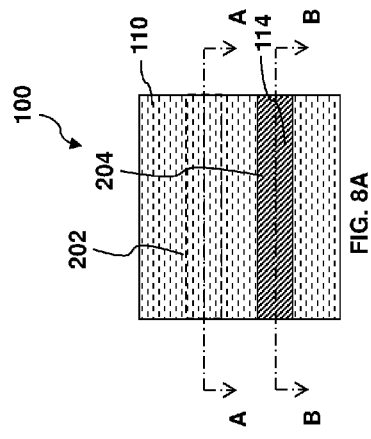
FIG. 7A
FIG. 7B
FIG. 7C
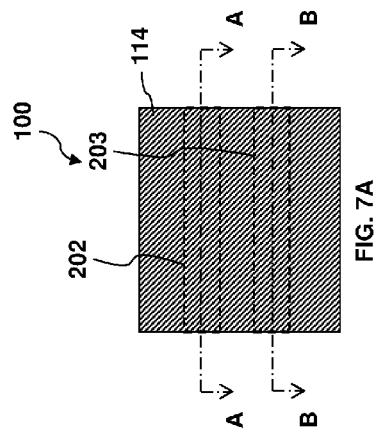
FIG. 8A
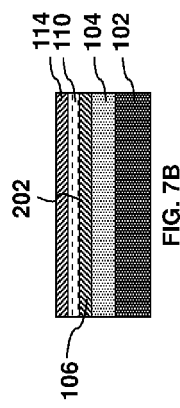
FIG. 8B
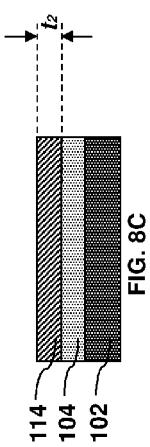
FIG. 8C
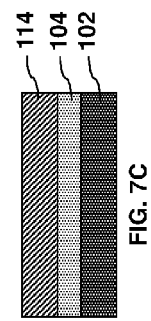

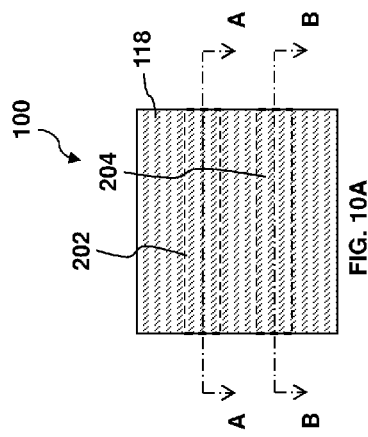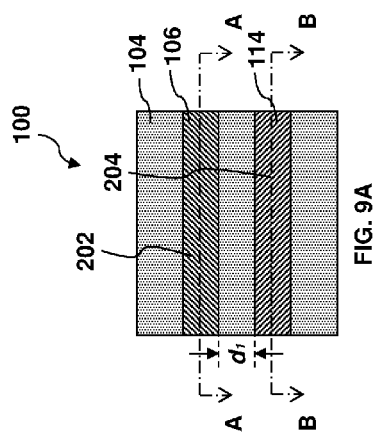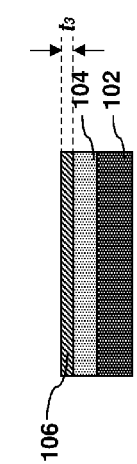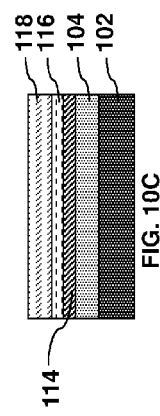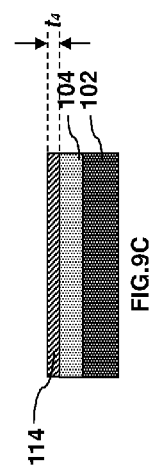

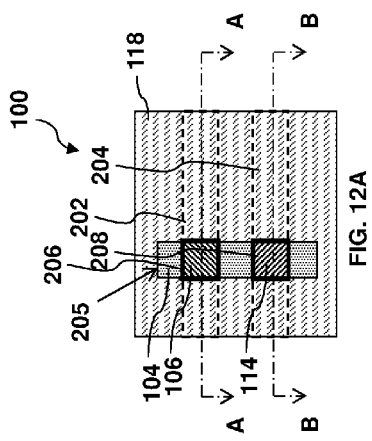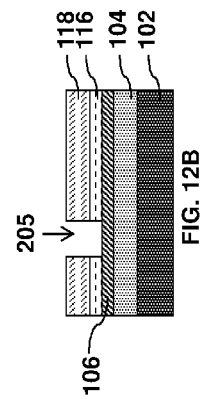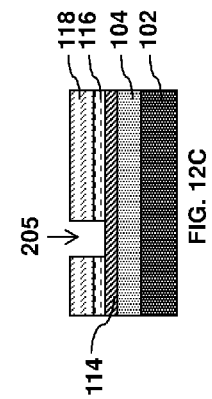
FIG. 11A  FIG. 11B  FIG. 11C
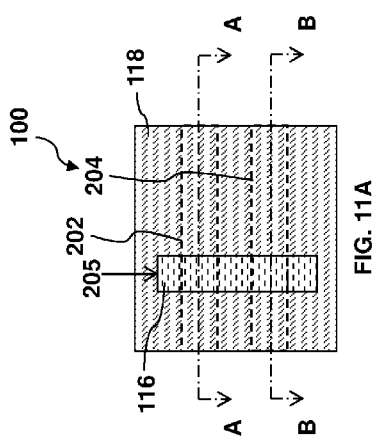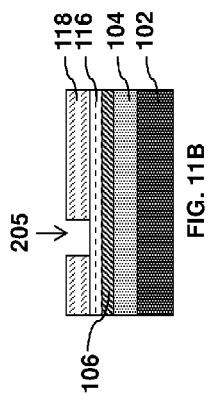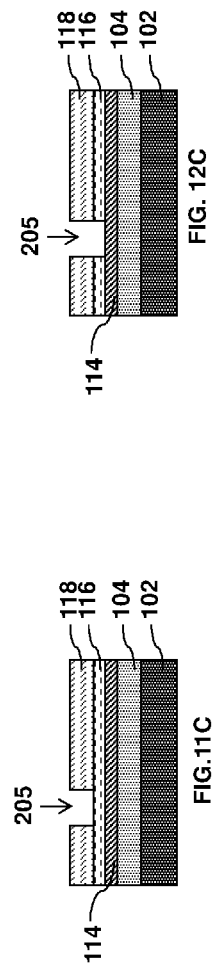
FIG. 12A  FIG. 12B  FIG. 12C

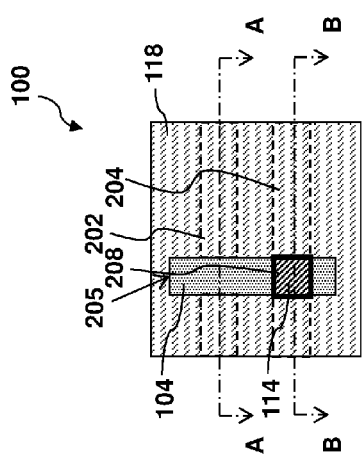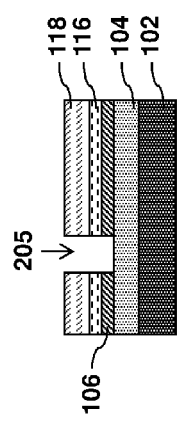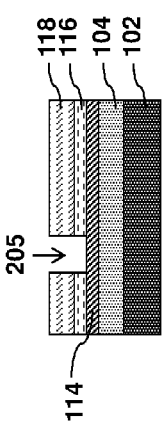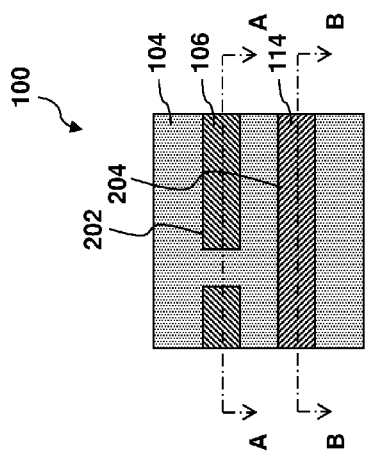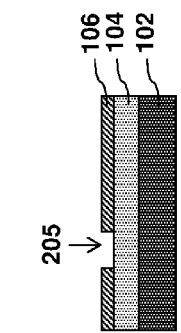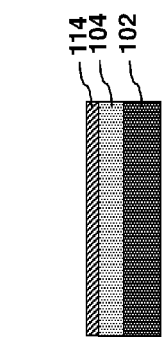

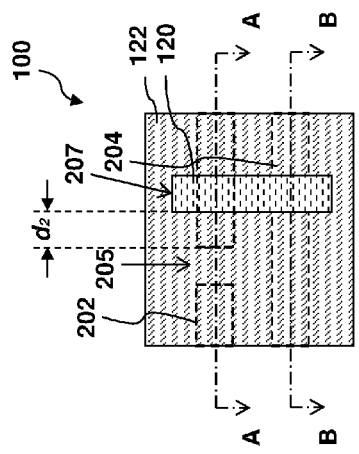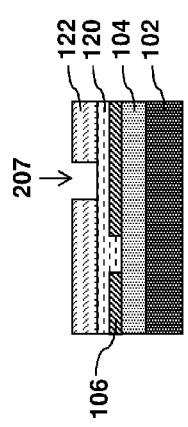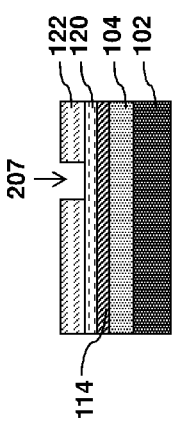
FIG. 15A  FIG. 15B  FIG. 15C
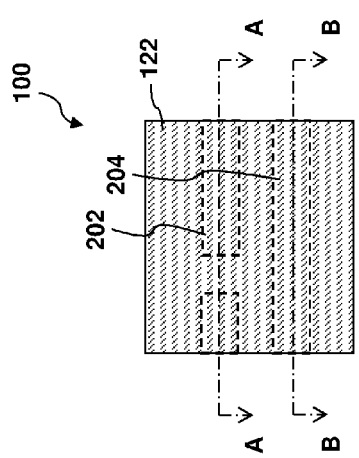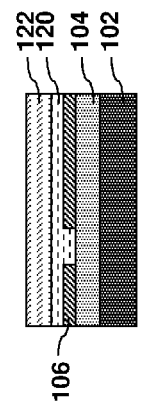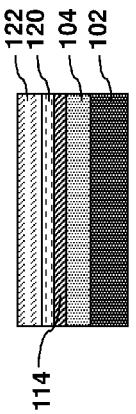
FIG. 16A  FIG. 16B  FIG. 16C

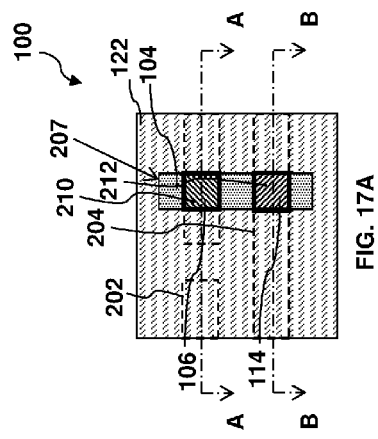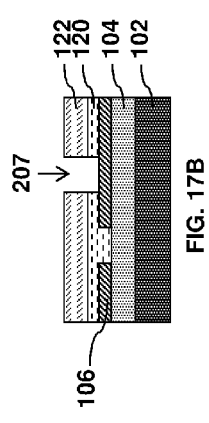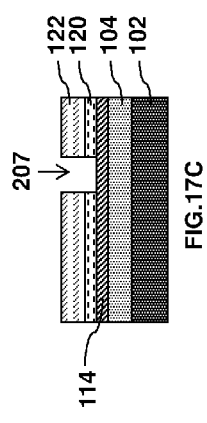
FIG. 17A  FIG. 17B  FIG.17C
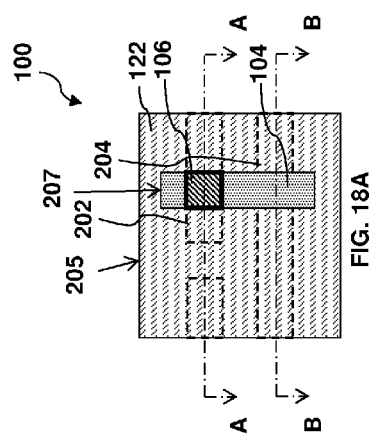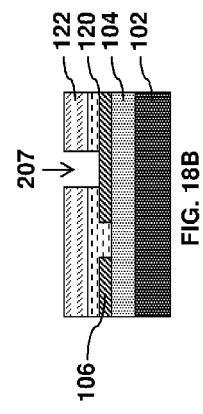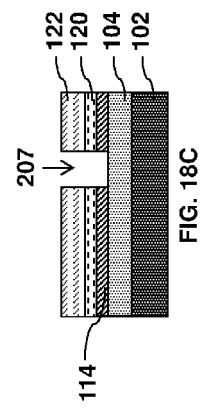
FIG. 18A  FIG. 18B  FIG. 18C

MECHANISMS FOR FORMING PATTERNS USING MULTIPLE LITHOGRAPHY PROCESSES

CROSS-REFERENCE TO RELATED APPLICATION

This is a continuation of U.S. Application No. 14/457,282, entitled "Mechanisms for Forming Patterns Using Multiple Lithography Processes," filed Aug. 12, 2014, now U.S. Patent No. 9,293,341, which claims priority to U.S. Provisional Application No. 62/019,100, filed Jun. 30, 2014. The entire disclosure of both applications is incorporated herein by reference.

The present disclosure is related to the following commonly-assigned patent applications, the entire disclosures of which are incorporated herein by reference: U.S. patent application Ser. No. 14/334,958 filed on Jul. 18, 2014, entitled "Mechanisms for Forming Patterns Using Multiple Lithography Processes", U.S. patent application Ser. No. 14/210,032 filed on Mar. 13, 2014, entitled "Mechanisms for Forming Patterns Using Multiple Lithography Processes", and U.S. patent application Ser. No. 14/334,904 filed on Jul. 18, 2014, entitled "Mechanisms for Forming Patterns Using Multiple Lithography Processes".

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

In the course of these benefits, efforts have been made to develop fabrication methods to realize the desire for smaller feature sizes. For example, methods have been developed to reduce the pitch of features on a substrate without changing the photolithography technology used. However, current methods have not been satisfactory in all respects. For example, process windows of critical dimension (CD) uniformity control and process flexibility of forming special features may be not sufficient.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 2A, 3A, 4A, 5A, 6A, 7A, 8A, 9A, 10A, 11A, 12A, 13A, 14A, 15A, 16A, 17A, 18A, 19A, 20A, and 21A are top views of a semiconductor structure at various fabrication stages, in accordance with some embodiments.

FIGS. 1B, 2B, 3B, 4B, 5B, 6B, 7B, 8B, 9B, 10B, 11B, 12B, 13B, 14B, 15B, 16B, 17B, 18B, 19B, 20B, and 21B are cross sectional views of the semiconductor structure along the dash line A-A of FIGS. 1A, 2A, 3A, 4A, 5A, 6A, 7A, 8A, 9A, 10A, 11A, 12A, 13A, 14A, 15A, 16A, 17A, 18A, 19A, 20A, and 21A respectively, in accordance with some embodiments.

FIGS. 1C, 2C, 3C, 4C, 5C, 6C, 7C, 8C, 9C, 10C, 11C, 12C, 13C, 14C, 15C, 16C, 17C, 18C, 19C, 20C, and 21C are cross sectional views of the semiconductor structure along the dash line B-B of FIGS. 1A, 2A, 3A, 4A, 5A, 6A, 7A, 8A, 9A, 10A, 11A, 12A, 13A, 14A, 15A, 16A, 17A, 18A, 19A, 20A, and 21A respectively, in accordance with some embodiments.

DETAILED DESCRIPTION

Figure 19A:
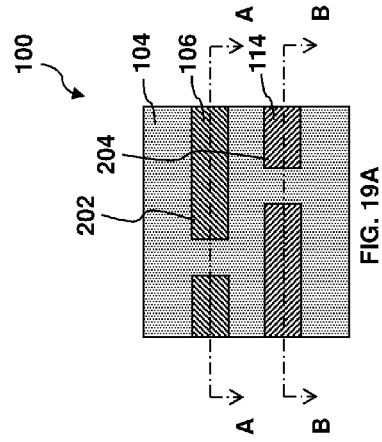

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIGS. 1A-1C, a substrate 102, a patterning-target layer 104, a first hard mask layer 106, and a first resist layer 108 are provided in a semiconductor structure 100. In some embodiments, the substrate 102 is a semiconductor substrate, such as a semiconductor wafer. The substrate 102 may include silicon in a crystalline structure. In some embodiments, the substrate 102 may include other elementary semiconductor, such as germanium; a compound semiconductor including silicon germanium, silicon carbide, gallium arsenide, indium arsenide, indium phosphide, and/or indium antimonide; an alloy semiconductor including SiGe, GaAsP, AlInAs, AlGaAs, GaInAs, GaInP, and/or GaInAsP; or combinations thereof. In some embodiments, the substrate 102 may be a silicon-on-insulator (SOI) substrate. The substrate 102 may further include additional features and/or material layers, such as various isolation features formed in the substrate. In some embodiments, the substrate 102 may include various doped regions, such as p-type doped regions and/or n-type doped regions configured and coupled to form various devices and functional features. All doping features may be achieved using a suitable process, such as ion implantation in various steps and techniques. In some embodiments, the substrate 102 may include other features, such as shallow trench isolation (STI). The substrate 102 may further include various material layers, such as gate material layers.

Referring to FIG. 1B, the patterning-target layer 104 is formed over the substrate 102. In some embodiments, the patterning-target layer 104 is the layer where the final patterns are formed over the substrate 102. In some embodiments, the patterning-target layer 104 has a thickness in a range from about 5 nm to about 50 nm. In some embodiments, the patterning-target layer 104 is formed using one or more conventional processes known in the art such as, chemical vapor deposition (CVD), spin-on methods, sputtering, oxidation, physical vapor deposition (PVD), atomic layer deposition (ALD), atomic layer CVD (ALCVD), thermal oxidation, and/or other suitable processes. In some embodiments, the patterning-target layer 104 includes one or more dielectric materials, such as silicon oxide ($SiO_2$), and/or silicon nitride ($Si_3N_4$). In some embodiments, the patterning-target layer 104 also includes metallic materials. In some embodiments, the patterning-target layer 104 is an upper portion of the substrate 102.

Referring to FIGS. 1B-1C, the first hard mask layer 106 is formed over the patterning-target layer 104. The first hard mask layer 106 is used to pattern, such as by etching, the patterning-target layer 104 as discussed later in detail in the present disclosure. In some embodiments, the first hard mask layer 106 includes one or more dielectric materials, such as silicon oxide, silicon nitride, and/or silicon oxynitride (SiON). In some embodiments, the first hard mask layer 106 includes titanium nitride (TiN). In some embodiments, the first hard mask layer 106 has a thickness in a range from about 5 nm to about 50 nm. In some embodiments, the first hard mask layer 106 is formed using one or more processes selected from the group consisting of CVD, PVD, ALD, spin-on method, sputtering, thermal oxidation, and a combination thereof.

Referring to FIGS. 1B-1C, in order to pattern the first hard mask layer 106, the first resist layer 108 is formed over the first hard mask layer 106. In some embodiments, the first resist layer 108 is a photoresist layer including chemicals that are sensitive to light, such as UV light. In some embodiments, the first resist layer 108 can also be a resist layer sensitive to other radiation, such as electron-beam. The first resist layer 108 may be formed using a spin-on coating method. The first resist layer 108 may include one or more organic polymer materials. In some embodiments, the first resist layer 106 has a thickness in a range from about 10 nm to about 100 nm.

Referring to FIGS. 2A-2C, a lithography process is performed to the first resist layer 108 to form a first group of feature(s)/a first feature 202 of the main pattern. In some embodiments, the first feature 202 include one or more line features as shown in FIG. 2A. In some embodiments, the first feature 202 is formed in the first resist layer 108 using a lithography process. In some embodiments, the lithography process includes exposing the first resist layer 108 to a light source using a mask having the first feature 202, performing post-exposure bake processes, and developing the first resist layer 108 to remove the portions of the first resist layer 108, so that the first feature 202 can be formed in the first resist layer 108 as shown in FIGS. 2A-2B. In some embodiments, the first feature 202 may include any other suitable features that can be formed using a lithography process. In some embodiments, a lithography process may further include other operations, such as soft baking and/or hard baking. In some embodiments, a lithography process may employ other technology, such as electron-beam direct writing.

Referring to FIGS. 3A-3C, the patterned first resist layer 108 is used as an etching mask to transfer the first feature 202 to the first hard mask layer 106. In some embodiments, the regions that are not covered by the patterned first resist layer 108 are removed using one or more etching processes, leaving the region(s) corresponding to the first feature 202 remain in the first hard mask layer 106 as shown in FIGS. 3A-3C. In some embodiments, the one or more etching processes include a selective dry etch process, such as a plasma etching process, a selective wet etching process, or a combination thereof. In some embodiments when the hard mask layer 106 includes silicon oxide, silicon nitride, and/or silicon oxynitride (SiON), the etching process includes using an etching gas including at least one of carbon tetrafluoride ($CF_4$), difluoromethane ($CH_2F_2$), trifluoromethane ($CHF_3$), other suitable etching gases, or combinations thereof. In some embodiments when the hard mask layer 106 includes titanium nitride, the etching process includes using an etching gas including at least chlorine ($Cl_2$) or any other suitable etching gases.

After transferring the first feature 202 to the first hard mask layer 106, the first resist layer 108 is removed. In some embodiments, the first resist layer 108 is removed by a wet stripping process, a plasma ashing process, other suitable methods, and/or combinations thereof. In some embodiments, the plasma ashing process includes using gases including at least one of oxygen ($O_2$), carbon dioxide ($CO_2$), nitrogen ($N_2$), hydrogen ($H_2$), or combinations thereof. As shown in FIG. 3B, the first feature 202 is exposed in the first hard mask layer 106 after removing the first resist layer 108.

Referring to FIGS. 4A-4C, a buffer layer 110 is formed over the first hard mask layer 106 to cover the first feature 202. A second resist layer 112 is then formed over the first hard mask layer 106. As shown in FIG. 4B, the buffer layer 110 is formed to cover both the patterning-target layer 104 and the first hard mask layer 106, and to provide a planar top surface. The buffer layer 110 may provide improved optical effect in the lithography process. In some embodiments, the buffer layer 110 includes one or more polymers including silicon. In some embodiments, the buffer layer 110 has a thickness in a range from about 10 nm to about 100 nm. In some embodiments, the buffer layer 110 is formed using a spin-on coating method and/or a suitable deposition method. In some embodiments, the buffer layer 110 includes organic polymer, Si-containing polymer, or both. In some embodiments, the buffer layer 110 includes a multilayer structure.

Referring to FIGS. 4B-4C, the second resist layer 112 is formed over the buffer layer 110. In some embodiments, the second resist layer 112 is a photoresist layer including chemicals that are sensitive to light, such as UV light. In some embodiments, the second resist layer 112 can also be an electron-beam sensitive layer. The second resist layer 112 may be formed using a spin-on coating method. The second resist layer 112 may include one or more organic polymer materials. In some embodiments, the second resist layer 112 has a thickness in a range from about 10 nm to about 100 nm. In some embodiments, the second resist layer 112 includes materials that are substantially similar to the materials of the first resist layer 108.

Referring to FIGS. 5A-5C, a lithography process is performed to the second resist layer 112 to form a trench 203. The trench 203 may be formed to fabricate a second group of features/a second feature 204 of the main pattern as discussed later in the present disclosure. The trench 203 may be formed using a lithography process. In some embodiments, the lithography process includes exposing the second resist layer 112 to a light source using a mask, performing post-exposure bake processes, and developing the second resist layer 112 to form the trench 203 in the second resist layer 112 as shown in FIGS. 5A and 5C.

As shown in FIG. 5A, in some embodiments, the spacing $d_1$ between the trench 203 and the first feature 202 may be substantially equal to or less than a minimum spacing value based on the design rules. Although the trench 203 is formed to be parallel to the first feature 202 in FIG. 5A, it is to be understood that the trench 203 may be formed in any suitable angle relative to the first feature 202. The spacing $d_1$ between the trench 203 and the first feature 202 may also be any suitable distance.

Referring to FIGS. 6A-6C, the patterned second resist layer 112 is used as an etching mask to transfer the trench pattern 203 to the buffer layer 110 using one or more etching processes to form the trench pattern 203 in the buffer layer 110 as shown in FIG. 6C. In some embodiments, the one or more etching processes include a selective dry etch process, such as a plasma etching process, a selective wet etching process, or a combination thereof. During the etching processes, the corresponding portions of the buffer layer 110 are selectively etched, while the patterning-target layer 104 remains unetched. In some embodiments, the etching process includes using an etching gas including carbon tetrafluoride ($CF_4$) and/or other suitable etching gases.

After etching the buffer layer 110 to form the trench 203, the second resist layer 112 is removed. The second resist layer 112 may be removed by a wet stripping process, a plasma ashing process, other suitable methods, and/or combinations thereof. The plasma ashing process includes using gases including at least one of oxygen ($O_2$), carbon dioxide ($CO_2$), nitrogen ($N_2$), hydrogen ($H_2$), or combinations thereof.

Referring to FIGS. 7A-7B, a second hard mask layer 114 is formed to fill in the trench 203 as well as to cover the buffer layer 110 as shown in FIGS. 7B-7C. The second hard mask layer 114 may be formed to pattern, such as by etching, the patterning-target layer 104 as discussed later in detail in the present disclosure. In some embodiments, the second hard mask layer 114 includes materials that are different from the first hard mask layer 106. In some embodiments, the second hard mask layer 114 may include similar materials but different in composition from the materials in the first hard mask layer 106. In some embodiments, the second hard mask layer 114 includes one or more materials, such as silicon nitride and/or silicon oxynitride. In some embodiments, the second hard mask layer 114 has a thickness in a range from about 5 nm to about 50 nm. The second hard mask layer 114 and the first hard mask layer 106 may have different etching selectivities in the following one or more etching processes. In some embodiments, the second hard mask layer 114 is formed using one or more processes selected from the group consisting of CVD, PVD, ALD, spin-on method, sputtering, thermal oxidation, and a combination thereof.

Referring to FIGS. 8A-8C, an upper portion of the second hard mask layer 114 is removed. In some embodiment, the upper portions of the second hard mask layer 114 may be removed using a chemical mechanical polish (CMP) method. In some embodiments, the upper portions of the second hard mask layer 114 may be etched using an etch-back process. In some embodiments, a combination of the CMP and etch-back process may also be used to remove the upper portions of the second hard mask layer 114. In some embodiments, the second hard mask layer 114 may be etched using a selective dry etch process, such as a plasma etching process, a selective wet etching process, or a combination thereof. In some embodiments when the hard mask layer 114 includes silicon oxide, silicon nitride, and/or silicon oxynitride (SiON), the etching process includes using an etching gas including at least one of carbon tetrafluoride ($CF_4$), difluoromethane ($CH_2F_2$), trifluoromethane ($CHF_3$), other suitable etching gases, or combinations thereof.

As shown in FIG. 8C, the upper portion of the second hard mask layer 114 may be removed to form a coplanar surface between the buffer layer 110 and the remained second hard mask layer 114 in the trench 203. In some embodiments, the CMP and/or etch-back process is performed so that the thickness $t_1$ of the first hard mask layer 106 and the buffer layer 110 combined may be substantially similar to the thickness $t_2$ of the remained second hard mask layer 114 in the trench 203.

Referring to FIGS. 9A-9C, the buffer layer 110 is removed. In some embodiments, the buffer layer 110 may also be removed using a chemical mechanical polish (CMP) method. In some embodiments, the buffer layer 110 is removed using one or more etching processes including a selective dry etch process, such as a plasma etching process, a selective wet etching process, or a combination thereof. During the removing processes, the buffer layer 110 is selectively removed, while the patterning-target layer 104 remains unetched. In some embodiments when the buffer layer 110 includes silicon-containing polymer, the etching process includes using an etching gas including carbon tetrafluoride ($CF_4$) or other suitable etching gases. In some embodiments when the buffer layer 110 includes organic polymer, the etching process includes using an etching gas including at least one of oxygen ($O_2$), carbon dioxide ($CO_2$), nitrogen ($N_2$), hydrogen ($H_2$), or combinations thereof. After the CMP process and/or the etch-back process as shown in FIGS. 9A-9C, the second feature 204 is formed in the second hard mask layer 114.

As shown in FIGS. 9A-9C, during the removing process of the buffer layer 110, an upper portion of the second hard mask layer 114 may also be removed. After removing the buffer layer 110, a thickness $t_3$ of the first hard mask layer 106 may be substantially similar to a thickness $t_4$ of the second hard mask layer 114. The spacing $d_1$ between the first feature 202 and the second feature 204 may be any suitable distance value. In some embodiments, the spacing $d_1$ between the first feature 202 and the second feature 204 may be substantially equal to or less than a minimum spacing value based on the design rules. In some embodiments, the $d_1$ may be as small as zero or the first feature 202 is overlapped with the second feature 204. As discussed in the present disclosure, the first hard mask layer 106 and the second hard mask layer 114 includes different materials so that the etching selectivities may be different in the following one or more etching processes. The first feature 202 and the second feature 204 may be formed using more than one lithography process. The first feature 202 in the first hard mask layer 106 and the second feature 204 in the second hard mask layer 114 may be reshaped using separate and independent etching processes as discussed in the present disclosure.

Referring to FIGS. 10A-10C, a buffer layer 116 is formed over the patterning-target layer 104, the first hard mask layer 106, and the second hard mask layer 114. The buffer layer 116 may be formed to cover both the first feature 202 and the second feature 204 as shown in FIG. 10A. In some embodiments, the buffer layer 116 includes organic polymer and/or Si-containing polymer. In some embodiments, the buffer layer 116 includes structures more than one layer. In some embodiments, the buffer layer 116 has a thickness in a range from about 10 nm to about 100 nm. In some embodiments, the buffer layer 116 is formed using a spin-on coating method and/or a suitable deposition method.

Still referring to FIGS. 10A-10C, a third resist layer 118 is formed over the buffer layer 116. In some embodiments, the third resist layer 118 is a photoresist layer including chemicals that are sensitive to light, such as UV light. In some embodiments, the third resist layer 118 can also be an electron-beam sensitive layer. In some embodiments, the third resist layer 118 is formed using a spin-on coating method. In some embodiments, the third resist layer 118 includes one or more organic polymer materials. In some embodiments, the third resist layer 118 has a thickness in a range from about 10 nm to about 100 nm.

Referring to FIGS. 11A-11C, a lithography process is performed to the third resist layer 118 to form a trench 205. The trench 205 may be a first cut pattern as discussed later in the present disclosure. In some embodiments, the trench 205 may overlap with the first feature 202 and the second feature 204 as shown in FIG. 11A. The lithography process may include exposing the third resist layer 118 to a light source using a mask, performing post-exposure bake processes, and developing the third resist layer 118 to form the trench 205 in the third resist layer 118 as shown in FIGS. 11A-11C.

Referring to FIGS. 12A-12C, the patterned third resist layer 118 is used as an etching mask to transfer the trench 205 to the buffer layer 116. In some embodiments, the regions of the buffer layer 116 exposed in the trench 205 are removed using one or more etching processes. In some embodiments, the buffer layer 116 may be etched using one or more etching processes including a selective dry etch process, such as a plasma etching process, a selective wet etching process, or a combination thereof. During the etching processes, the buffer layer 116 is selectively etched, while the patterning-target layer 104, the first hard mask layer 106, and the second hard mask layer 114 remain unetched. In some embodiments when the buffer layer 116 includes silicon-containing polymer, the etching process includes using an etching gas including carbon tetrafluoride ($CF_4$) or other suitable etching gases. In some embodiments when the buffer layer 116 includes organic polymer, the etching process includes using an etching gas including at least one of oxygen ($O_2$), carbon dioxide ($CO_2$), nitrogen ($N_2$), hydrogen ($H_2$), or combinations thereof.

As shown in FIG. 12A, after forming the trench 205 in the buffer layer 116, an overlap portion 206 in the first hard mask layer 106 is exposed. The overlap portion 206 is an overlapping portion between the first feature 202 and the trench 205. An overlap portion 208 in the second hard mask layer 114 is exposed. The overlap portion 208 is an overlapping portion between the second feature 204 and the trench 205. In some examples, the overlap portion 206 and the overlap portion 208 may be used to cut the first feature and the second feature of the main pattern separately and independently as discussed later in detail in the present disclosure.

Referring to FIGS. 13A-13C, the patterned resist layer 118 and/or buffer layer 116 is used as an etching mask to transfer the trench 205 to the first hard mask layer 106 to reshape the first feature 202. In some embodiments, the buffer layer 116 is optional, and when the third resist layer 118 is formed over the first hard mask layer 106 and the second hard mask layer 114 without using the buffer layer 116, the patterned third resist layer 118 is used as an etching mask to transfer the trench 205 to the first feature 202 in the first hard mask layer 106. In some embodiments, the exposed portion of the first hard mask layer 106, e.g., the overlap portion 206 in the first hard mask layer 106, may be removed using one or more selective etching processes. During the selective etching process, the overlap portion 206 in the first hard mask layer 106 is removed without etching the second hard mask layer 114 or the patterning-target layer 104. The selective etching process for etching the first hard mask layer 106 may include a selective dry etch process, such as a plasma etching process, a selective wet etching process, or a combination thereof. In some embodiments when the first hard mask layer 106 includes titanium nitride (TiN) and the second hard mask layer 114 includes silicon nitride ($Si_3N_4$), the etching process includes using an etching gas including at least chlorine ($Cl_2$) or any other suitable etching gases or combinations thereof.

Referring to FIGS. 14A-14C, the third resist layer 118 and the buffer layer 116 are removed. In some embodiments, the third resist layer 118 is removed by a wet stripping process, a plasma ashing process, and/or other suitable methods. In some embodiments, the plasma ashing process includes using gases including at least one of oxygen ($O_2$), carbon dioxide ($CO_2$), nitrogen ($N_2$), hydrogen ($H_2$), or combinations thereof. In some embodiments, the buffer layer 116 is removed using one or more etching processes including a selective dry etch process, such as a plasma etching process, a selective wet etching process, or a combination thereof. In some embodiments, the buffer layer 116 may also be removed using a chemical mechanical polish (CMP) method. During the removing processes, the buffer layer 116 is selectively removed, while the patterning-target layer 104, the first hard mask layer 106, and the second hard mask layer 114 remain unetched. In some embodiments, the etching process may include using an etching gas including carbon tetrafluoride ($CF_4$) and/or other suitable etching gases. After removing the third resist layer 118 and the buffer layer 116, the reshaped first feature 202 in the first hard mask layer 106, and the second feature 204 in the second hard mask layer 114 are exposed as shown in FIG. 14A.

Referring to FIGS. 15A-15C, a buffer layer 120 is formed over the patterning-target layer 104, the first hard mask layer 106, and the second hard mask layer 114. The buffer layer 120 may be formed to cover both the reshaped first feature 202 and the second feature 204 as shown in FIGS. 15A-15C. The buffer layer 120 may also be formed to fill in the trench 205 as shown in FIG. 15B. In some embodiments, the buffer layer 120 may include one or more polymers including silicon. In some embodiments, the buffer layer 120 has a thickness in a range from about 10 nm to about 100 nm. In some embodiments, the buffer layer 120 is formed using a spin-on coating method and/or a suitable deposition method.

Still referring to FIGS. 15A-15C, a fourth resist layer 122 is formed over the buffer layer 120. In some embodiments, the fourth resist layer 122 is a photoresist layer including chemicals that are sensitive to light, such as UV light. In some embodiments, the fourth resist layer 122 can also be an electron-beam sensitive layer. In some embodiments, the fourth resist layer 122 is formed using a spin-on coating method. In some embodiments, the fourth resist layer 122 includes one or more organic polymer materials. In some embodiments, the fourth resist layer 122 has a thickness in a range from about 10 nm to about 100 nm.

Referring to FIGS. 16A-16C, a lithography process is performed to the fourth resist layer 122 to form a trench 207. The trench 207 may be formed to form a second cut pattern in the main pattern as discussed later in the present disclosure. In some embodiments, the trench 207 may overlap with the first feature 202 and the second feature 204 as shown in FIG. 16A. The lithography process may include exposing the fourth resist layer 122 to a light source using a mask, performing post-exposure bake processes, and developing the fourth resist layer 122 to form the trench 207 in the fourth resist layer 122 as shown in FIGS. 16A-16C.

As shown in FIG. 16A, the spacing $d_2$ between the removed portion of the first feature 202/the trench 205 and the removed portion of the second feature 204/the trench 207 may be substantially equal to or less than a minimum spacing value based on the design rules. Although the trench 207 is formed to be parallel to the trench 205 in FIG. 16A, it is to be understood that the trench 207 may be formed in any suitable angle relative to the trench 205. The spacing $d_2$ between the trench 207 and the trench 205 may also be any suitable distance. In some embodiments, the $d_2$ may be as small as zero, or the trench 207 is overlapped with the trench 205.

Referring to FIGS. 17A-17C, the patterned fourth resist layer 122 is used as an etching mask to transfer the trench 207 to the buffer layer 120. In some embodiments, the regions of the buffer layer 120 exposed in the trench 207 are removed using one or more etching processes. In some embodiments, the buffer layer 120 may be etched using one or more selective etching processes including a selective dry etch process, such as a plasma etching process, a selective wet etching process, or a combination thereof. During the etching processes, the buffer layer 120 is selectively etched, while the patterning-target layer 104, the first hard mask layer 106, and the second hard mask layer 114 remain unetched. In some embodiments, the etching process may include using an etching gas including carbon tetrafluoride ($CF_4$) and/or other suitable etching gases.

As shown in FIG. 17A, after forming the trench 207 in the buffer layer 120, an overlap portion 210 in the first hard mask layer 106 is exposed. The overlap portion 210 is an overlapping portion between the first feature 202 and the trench 207. An overlap portion 212 in the second hard mask layer 114 is exposed. The overlap portion 212 is an overlapping portion between the second feature 204 and the trench 207. In some examples, the overlap portion 210 and the overlap portion 212 may be used to reshape the first feature 202 and the second feature 204 of the main pattern separately and independently as discussed later in detail in the present disclosure.

Referring to FIGS. 18A-18C, the patterned buffer layer 120 is used as an etching mask to transfer the trench 207 to the second hard mask layer 114. In some embodiments, the buffer layer 120 is optional, and when the fourth resist layer 122 is formed over the first hard mask layer 106 and the second hard mask layer 114 without using the buffer layer 120, the patterned fourth resist layer 122 is used as an etching mask to transfer the trench 207 to the second feature 204 in the second hard mask layer 114. In some embodiments, the exposed portion of the second hard mask layer 114, e.g., the overlap portion 212 in the second hard mask layer 114, may be removed using one or more selective etching processes. During the selective etching process, the overlap portion 212 in the second hard mask layer 114 is removed without etching the first hard mask layer 106 or the patterning-target layer 104. The selective etching process for etching the second hard mask layer 114 may include a selective dry etch process, such as a plasma etching process, a selective wet etching process, or a combination thereof. In some embodiments when the first hard mask layer 106 includes titanium nitride (TiN) and the second hard mask layer 114 includes silicon nitride ($Si_3N_4$), the etching process includes using an etching gas including at least one of carbon tetrafluoride ($CF_4$), difluoromethane ($CH_2F_2$), trifluoromethane ($CHF_3$), other suitable etching gases, or combinations thereof.

Figure 19B:
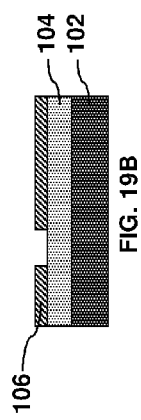
Figure 19C:
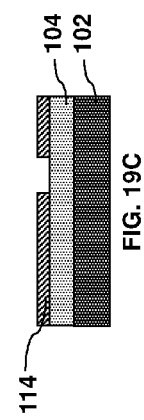

Referring to FIGS. 19A-19C, the fourth resist layer 122 and the buffer layer 120 are removed. In some embodiments, the fourth resist layer 122 is removed by a wet stripping process, a plasma ashing process, and/or other suitable methods. In some embodiments, the plasma ashing process includes using gases including at least one of oxygen ($O_2$), carbon dioxide ($CO_2$), nitrogen ($N_2$), hydrogen ($H_2$), or combinations thereof. In some embodiments, the buffer layer 120 is removed using one or more etching processes including a selective dry etch process, such as a plasma etching process, a selective wet etching process, or a combination thereof. In some embodiments, the buffer layer 120 may also be removed using a chemical mechanical polish (CMP) method. During the removing processes, the buffer layer 120 is selectively removed, while the patterning-target layer 104, the first hard mask layer 106, and the second hard mask layer 114 remain unetched. In some embodiments, the etching process may include using an etching gas including carbon tetrafluoride ($CF_4$) and/or other suitable etching gases. After removing the fourth resist layer 122 and the buffer layer 120, the reshaped first feature 202 in the first hard mask layer 106, and the reshaped second feature 204 in the second hard mask layer 114 are exposed as shown in FIG. 19A.

Figure 20A:
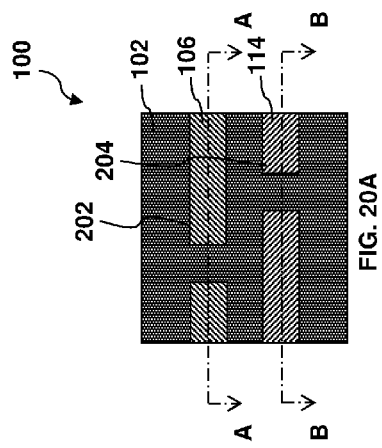
Figure 20B:
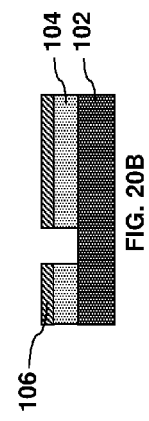
Figure 20C:
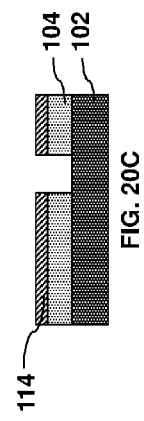

Referring to FIGS. 20A-20C, the reshaped first feature 202 and the reshaped second feature 204 are transferred to the patterning-target layer 104 using the first hard mask layer 106 and the second hard mask layer 114 as etching masks. In some embodiments, the patterning-target layer 104 is etched using one or more selective etching processes. The selective etching process may include a selective dry etch process, such as a plasma etching process, a selective wet etching process, or a combination thereof. In some embodiments when the first hard mask layer 106 includes titanium nitride (TiN) and the second hard mask layer 114 includes silicon nitride ($Si_3N_4$), the etching process includes using an etching gas including at least one of carbon tetrafluoride ($CF_4$), difluoromethane ($CH_2F_2$), trifluoromethane ($CHF_3$), other suitable etching gases, or combinations thereof.

Figure 21A:
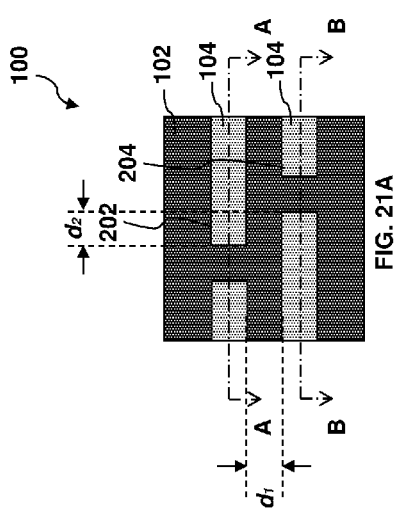
Figure 21B:
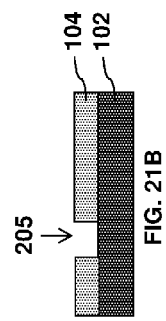
Figure 21C:
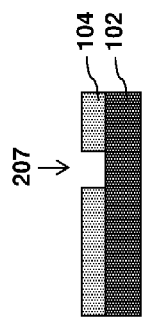

Referring to FIGS. 21A-21C, the first hard mask layer 106 and the second hard mask layer 114 are removed to expose the final pattern in the patterning-target layer 104. In some embodiments, the first hard mask layer 106 and the second hard mask layer 114 are removed using a chemical mechanical polish (CMP) process. In some embodiments, the first hard mask layer 106 and the second hard mask layer 114 are removed using one or more etching processes. The etching processes may include a selective dry etch process, such as a plasma etching process, a selective wet etching process, or a combination thereof. During the etching processes, the first hard mask layer 106 and the second hard mask layer 114 may be selectively etched, while the patterning-target layer 104 remains unetched. In some embodiments when the first hard mask layer 106 includes titanium nitride (TiN) and the second hard mask layer 114 includes silicon nitride ($Si_3N_4$), the etching process includes using an etching gas including at least chlorine ($Cl_2$) or any other suitable etching gases, or combinations thereof. In some embodiments, the hard mask layer 106 and 114 may also be removed using a chemical mechanical polish (CMP) process.

As shown in FIGS. 21A-21C, the final pattern may include a reshaped first feature 202 and a reshaped second feature 204 in the patterning-target layer 104. The reshaped first feature 202 and the reshaped second feature 204 may be formed separately and independently using different cut patterns in different etching processes, without affecting each other. In some embodiments, the spacing $d_1$ between the first reshaped feature 202 and the second reshaped feature 204 may be any suitable distance value. In some embodiments, the spacing $d_1$ may be substantially equal to or less than a minimum spacing value based on the design rules. In some embodiments, the spacing $d_2$ between the trench 205 and the trench 207 may be any suitable distance, for example, the spacing $d_2$ may be substantially equal to or less than a minimum spacing value based on the design rules.

Figure 22:
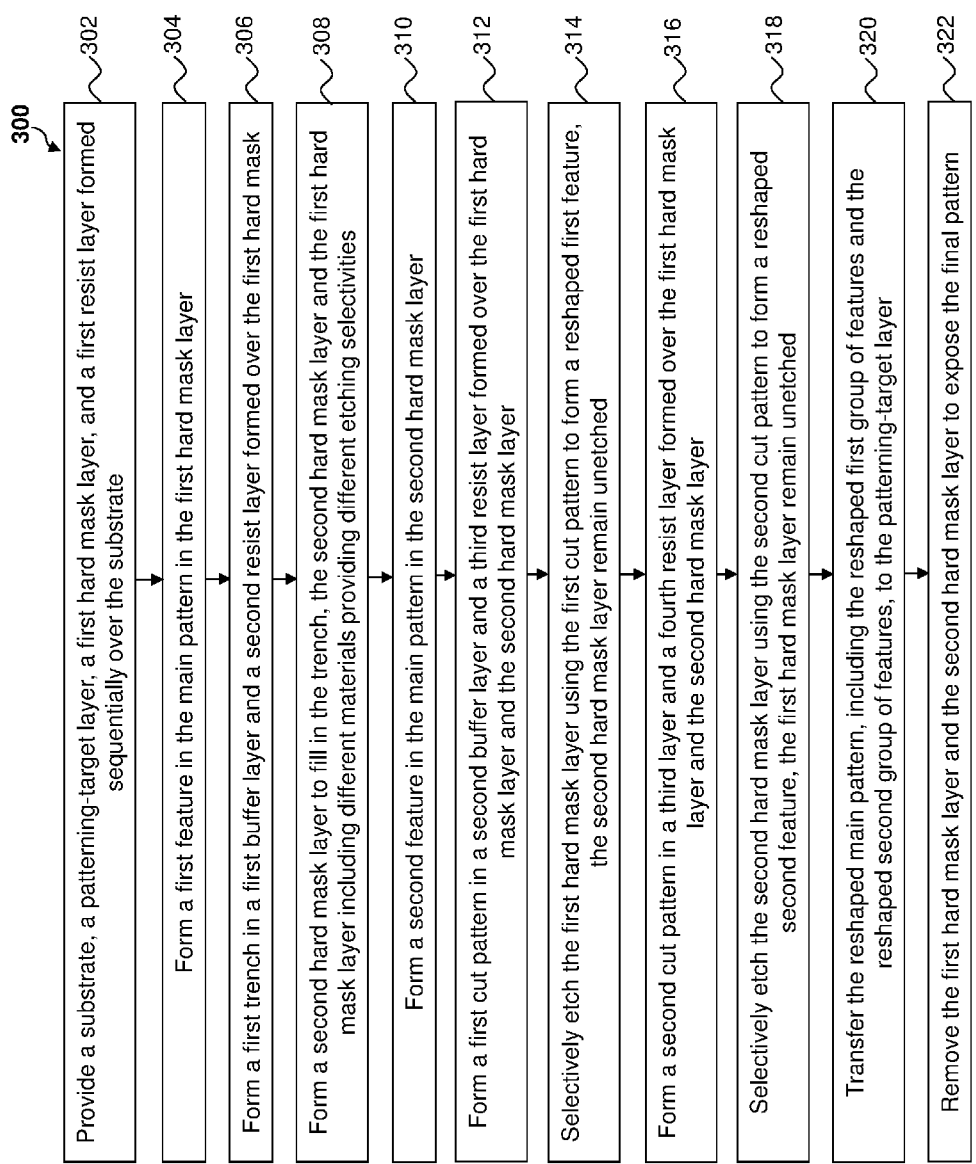
FIG. 22 is a flowchart showing a method of forming patterns using multiple lithography processes in the semiconductor structure, in accordance with some embodiments.

FIG. 22 illustrates a method 300 of forming patterns using multiple lithography processes combined with multiple etching processes in the semiconductor structure 100 as discussed with reference to FIGS. 1A-1C to 21A-21C. Method 300 starts from operation 302 by providing the substrate 102, the patterning-target layer 104 formed over the substrate 102, and the first hard mask layer 106 formed on the patterning-target layer 104, and the first resist layer 108 formed over the first hard mask layer 106. The patterning-target layer 104 and/or the first hard mask layer 106 may be formed by one or more processes selected from the group consisting of CVD, PVD, ALD, spin-on method, sputtering, thermal oxidation, and a combination thereof. The first resist layer 108 may be formed using a spin-on coating method.

Method 300 proceeds to operation 304 by forming a first feature 202 in the first hard mask layer 106. In some embodiments, the first feature 202 includes a line feature. In some embodiments, the first feature 202 is first formed in the first resist layer 108 using a lithography process. In some embodiments, the lithography process includes exposing the first resist layer 108 to a light source, performing post-exposure bake processes, and developing the first resist layer 108. The first feature 202 is then transferred to the first hard mask layer 106 by one or more etching processes using the patterned first resist layer 108 as an etching mask. In some embodiments, the first resist layer 108 is then removed by a wet stripping process, a plasma ashing process, and/or other suitable methods.

Method 300 proceeds to operation 306 by forming a trench 203 in a first buffer layer 110 and a second resist layer 112. The first buffer layer 110 may be formed over the first hard mask layer 106, and the second resist layer 112 may be formed over the first buffer layer 110. A lithography process and one or more etching processes may be used to form the trench 203 in the second resist layer 112 and the first buffer layer 110. The second resist layer 112 may then be removed.

Method 300 proceeds to operation 308 by forming a second hard mask layer 114 to fill the trench 203. The second hard mask layer 114 may include materials different from the materials used to form the first hard mask layer 106. The second hard mask layer 114 and the first hard mask layer 106 may have different etching selectivities.

Method 300 proceeds to operation 310 by forming a second feature 204 in the second hard mask layer 114. The second feature 204 in the second hard mask layer 116 may be formed by removing an upper portion of the second hard mask layer 114 using a CMP process and/or an etch-back process. The first buffer layer 110 may then be removed using one or more etching processes.

Method 300 proceeds to operation 312 by forming a first cut pattern, e.g., a trench 205. A second buffer layer 116 and a third resist layer 118 may be formed over the first hard mask layer and the second hard mask layer. A lithography process may be used to pattern the third resist layer 118 to form the first cut pattern. The first cut pattern may be transferred to the second buffer layer 116 by an etching process.

Method 300 proceeds to operation 314 by selectively etching the first hard mask layer 106 using the patterned third resist layer 118 and/or the patterned buffer layer 116 as etching masks. The second hard mask layer 114 and the patterning-target layer 104 remain unetched. A reshaped first feature 202 is formed in the first hard mask layer 106 at operation 314.

Method 300 proceeds to operation 316 by forming a second cut pattern, e.g., a trench 207. A third buffer layer 120 and a fourth resist layer 122 may be formed over the first hard mask layer and the second hard mask layer. A lithography process may be used to pattern the fourth resist layer 122 to form the second cut pattern. The second cut pattern may be transferred to the third buffer layer 120 by an etching process.

Method 300 proceeds to operation 318 by selectively etching the second hard mask layer 114 using the patterned fourth resist layer 122 and/or the patterned buffer layer 120 as etching masks. The first hard mask layer 106 and the patterning-target layer 104 remain unetched. A reshaped second feature 204 is formed in the second hard mask layer 004 is formed at operation 318.

Method 300 proceeds to operation 320 by transferring the reshaped first feature 202 and the reshaped second feature 204 to the patterning-target layer 104. An selectively etching process may be performed to the patterning-target layer 104 using the reshaped first feature 202 in the first hard mask layer 106 and the reshaped second feature 204 in the second hard mask layer 114 as etching masks.

Method 300 proceeds to operation 322 by removing the first hard mask layer 106 and the second hard mask layer 114 to form the final pattern in the patterning-target layer 104. In some embodiments, the first hard mask layer 106 and the second hard mask layer 114 may be removed using a CMP process. The first hard mask layer 106 and the second hard mask layer 114 may also be selectively etched, while the patterning-target layer 104 remains unetched.

The present embodiments describe one or more manufacturable and low-cost mechanisms for forming patterns in semiconductor devices using multiple lithography processes and multiple etching processes. The mechanisms involve forming multiple groups of features of the main pattern using different materials to provide different etching selectivities from each other. The mechanisms also involve using multiple cutting patterns to reshape different groups of features in the main pattern correspondingly. The mechanisms also involve using multiple lithography processes to form multiple cutting patterns, and using multiple etching processes to reshape the different groups of features separately and independently.

The mechanisms discussed in the present disclosure enable reshaping different groups of features in the main patterns using different cut patterns respectively without affecting each other. The mechanisms also enable forming the spacing between the first and second groups of features, and the spacing between the first cut pattern and the second cut pattern flexible because multiple lithography processes and multiple etching processes are used in the present disclosure. The mechanisms discussed in the present disclosure are applicable to other lithography process, such as extreme ultraviolet lithography (EUV), or electron-beam direct write (EBDW) process. The mechanisms are also applicable for generating the guide pattern for direct self-assembly (DSA) process.

The present disclosure provides a method for forming patterns in a semiconductor device. In accordance with some embodiments, the method includes providing a substrate and a patterning-target layer formed over the substrate; forming a first feature in a first hard mask layer formed over the patterning-target layer; forming a second feature in a second hard mask layer formed over the patterning-target layer, the first hard mask layer having a different etching selectivity from the second hard mask layer; selectively removing a portion of the first feature in the first hard mask layer within a first trench to formed a reshaped first feature; selectively removing a portion of the second feature in the second hard mask layer within a second trench to form a reshaped second feature; and transferring the reshaped first feature and the reshaped second feature to the patterning-target layer.

The present disclosure provides yet another embodiment of a method for forming patterns in a semiconductor device. In accordance with some embodiments, the method includes providing a substrate, a patterning-target layer formed over the substrate, and a first hard mask layer formed over the patterning-target layer; performing a first lithography to form a first feature in the first hard mask layer, the first hard mask layer including a first material; forming a buffer layer over the first hard mask layer; performing a second lithography to form a first trench in the buffer layer; forming a second feature in the first trench using a second hard mask layer, the second hard mask layer including a second material; forming a first resist layer over the first hard mask layer and the second hard mask layer; performing a third lithography to form a second trench in the first resist layer; etching the first hard mask layer within the second trench using the first resist layer as an etching mask; forming a second resist layer over the first hard mask layer and the second hard mask layer; performing a fourth lithography to form a third trench in the second resist layer; and etching the second hard mask layer within the third trench using the second resist layer as an etching mask; and etching the patterning-target layer using the first hard mask layer and the second hard mask layer as etching masks.

The present disclosure provides yet another embodiment of a method for forming patterns in a semiconductor device. In accordance with some embodiments, the method includes forming a first feature in a first hard mask layer using a first lithography, the first hard mask layer being formed over a patterning-target layer, the first hard mask layer having a different etching selectivity from the second hard mask layer; forming a second feature in a second hard mask layer using a second lithography, the second hard mask layer being formed over the patterning-target layer; forming a first trench in a first material layer formed over the first hard mask layer and the second hard mask layer; etching a portion of the first hard mask layer exposed within the first trench to define a first trimmed line feature; forming a second trench in a second material layer formed over the first hard mask layer and the second hard mask layer; etching a portion of the second hard mask layer exposed within the second trench to define a second trimmed line feature; and etching the patterning-target layer using the first trimmed line feature and second trimmed line feature as an etching mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming patterns in a semiconductor device, comprising:
   providing a substrate and a patterning-target layer formed over the substrate;
   forming a first feature in a first hard mask layer formed over the patterning-target layer;
   forming a second feature in a second hard mask layer formed over the patterning-target layer, the first hard mask layer having a different etching selectivity from the second hard mask layer; and
   selectively removing a first portion of the first feature within a first trench, thereby forming a reshaped first feature.

2. The method of claim 1, wherein the first trench exposes a portion of the second feature, and wherein the selectively removing of the first portion of the first feature does not etch the portion of the second feature.

3. The method of claim 1, further comprising:
   transferring the reshaped first feature and the second feature to the patterning-target layer.

4. The method of claim 1, further comprising:
   selectively removing a first portion of the second feature within a second trench, thereby forming a reshaped second feature.

5. The method of claim 4, wherein the second trench exposes a second portion of the first feature, and wherein the selectively removing of the first portion of the second feature does not etch the second portion of the first feature.

6. The method of claim 4, further comprising:
   transferring the reshaped first feature and the reshaped second feature to the patterning-target layer.

7. The method of claim 1, wherein the first feature is a line feature and the forming of the second feature is after the forming of the first feature, and wherein the forming of the second feature includes:
   forming a buffer layer over the first hard mask layer and the patterning-target layer;
   etching the buffer layer to form a buffer trench;
   depositing the second hard mask layer to fill the buffer trench and to cover the buffer layer; and
   removing an upper portion of the second hard mask layer to form the second feature in the second hard mask layer.

8. The method of claim 7, wherein the removing of the upper portion of the second hard mask layer includes a chemical mechanical polish (CMP) method.

9. The method of claim 7, wherein the removing of the upper portion of the second hard mask layer includes a selective etching process.

10. The method of claim 7, further comprising:
    removing the buffer layer using an etching process that is selectively tuned to remove the buffer layer while the first feature, the second feature, and the patterning-target layer remain substantially unchanged.

11. The method of claim 1, wherein a thickness of the second feature is substantially similar to a thickness of the first feature.

12. The method of claim 1, further comprising:
forming a resist layer over the first hard mask layer and the second hard mask layer; and
patterning the resist layer to form the first trench.

13. The method of claim 12, further comprising:
forming a buffer layer between the resist layer and the first hard mask layer and the second hard mask layer; and
etching the buffer layer using the resist layer as an etching mask.

14. A method for forming patterns in a semiconductor device, comprising:
providing a substrate, a patterning-target layer over the substrate, and a first hard mask layer over the patterning-target layer, the first hard mask layer including a first material;
performing a first lithography to form a first line feature in the first hard mask layer;
forming a buffer layer over the first line feature and the patterning-target layer;
performing a second lithography to form a first trench in the buffer layer;
forming a second line feature in the first trench, the second line feature including a second material;
forming a first resist layer over the first and second line features;
performing a third lithography to form a second trench in the first resist layer; and
etching the first line feature within the second trench using the first resist layer as an etching mask, wherein the etching of the first line feature does not etch the second line feature.

15. The method of claim 14, further comprising:
forming a second resist layer over the first and second line features;
performing a fourth lithography to form a third trench in the second resist layer;
etching the second line feature within the third trench using the second resist layer as an etching mask, wherein the etching of the second line feature does not etch the first line feature; and
etching the patterning-target layer using an etching mask that includes remaining portions of the first and second line features.

16. The method of claim 14, wherein the first material includes titanium nitride, and
wherein the second material includes one or more materials selected from the group consisting of silicon nitride and silicon oxynitride.

17. The method of claim 14, wherein the etching of the second line feature includes using one or more etching gases selected from the group consisting of carbon tetrafluoride, difluoromethane, and trifluoromethane, and wherein the etching of the first line feature includes using chlorine.

18. The method of claim 14, wherein the forming of the second line feature includes:
depositing a second hard mask layer to fill in the first trench and to cover the buffer layer; and
removing an upper portion of the second hard mask layer, wherein the second line feature is part of remaining portions of the second hard mask layer.

19. A method for forming patterns in a semiconductor device, comprising:
forming a first feature in a first hard mask layer using a first lithography, the first hard mask layer being formed over a patterning-target layer;
forming a second feature in a second hard mask layer using a second lithography, the second hard mask layer being formed over the patterning-target layer;
forming a first trench in a first material layer formed over the first hard mask layer and the second hard mask layer; and
etching a portion of the first feature exposed within the first trench to form a reshaped first feature, wherein the etching of the portion of the first feature does not etch the second hard mask layer.

20. The method of claim 19, further comprising:
etching the patterning-target layer based on the reshaped first feature of the first hard mask layer and further based on the second hard mask layer.

* * * * *